United States Patent [19]

Tsuya et al.

[11] 4,339,508
[45] Jul. 13, 1982

[54] METHOD FOR MANUFACTURING A THIN AND FLEXIBLE RIBBON OF SUPERCONDUCTOR MATERIAL

[75] Inventors: Noboru Tsuya; Kenichi Arai, both of Sendai, Japan

[73] Assignee: Shiro Maeda, Sendai, Japan

[21] Appl. No.: 170,684

[22] Filed: Jul. 21, 1980

Related U.S. Application Data

[63] Continuation of Ser. No. 962,602, Nov. 21, 1978, abandoned.

[30] Foreign Application Priority Data

Nov. 28, 1977 [JP] Japan ................................ 52/142522

[51] Int. Cl.³ .................... B21C 37/00; B22D 11/06; B22D 11/10; H01L 39/24
[52] U.S. Cl. .................................. 428/606; 428/611; 428/336; 428/338; 428/930; 148/3; 148/403; 29/599; 164/429; 164/433; 164/437; 222/593; 222/591; 400/901
[58] Field of Search ......... 29/599; 174/126 S, 15 CA; 164/87, 427, 429, 433, 437; 222/593, 591; 427/62; 148/2, 3, 32; 75/174, 165, 152, 134 G, 134 F, 134 V, 175 R, 134 S; 428/611, 336, 338, 606, 930, 627, 621

[56] References Cited

U.S. PATENT DOCUMENTS

| | | | |
|---|---|---|---|
| 1,756,196 | 4/1930 | Hopkins et al. | 164/87 |
| 3,381,739 | 5/1968 | Hart | 164/87 |
| 3,427,154 | 2/1969 | Mader et al. | 75/122 |
| 3,576,207 | 4/1971 | Grenfell | 164/87 X |
| 3,595,693 | 7/1971 | Cecil et al. | 427/62 |
| 3,596,804 | 8/1971 | Barrow | 222/593 |
| 3,645,657 | 2/1972 | Ostot et al. | 425/72 R |
| 3,748,728 | 7/1973 | Watson | 29/599 |
| 3,838,185 | 9/1974 | Maringer et al. | 264/8 |
| 3,845,805 | 11/1974 | Kavesh | 164/462 |
| 3,896,203 | 7/1975 | Maringer et al. | 164/87 X |
| 4,000,014 | 12/1976 | Winter | 29/599 X |
| 4,138,445 | 2/1979 | Nogi et al. | 525/58 |
| 4,221,257 | 9/1980 | Narasimhan | 164/87 |

FOREIGN PATENT DOCUMENTS

| | | |
|---|---|---|
| 2424840 | 12/1974 | Fed. Rep. of Germany . |
| 1459716 | 2/1975 | United Kingdom . |
| 1525959 | 10/1975 | United Kingdom . |
| 1540771 | 2/1976 | United Kingdom . |
| 1549124 | 4/1977 | United Kingdom . |

OTHER PUBLICATIONS

Journal of Applid Physics (1975), vol. 46, p. 1787 et seq.
Physical Review Letters (1972), vol. 30, p. 92 et seq.
Physics Reports (1976), vol. 27C, No. 4.
Physics Review B (1975), vol. 11, p. 150 et seq.

*Primary Examiner*—George F. Lesmes
*Assistant Examiner*—Alexander S. Thomas
*Attorney, Agent, or Firm*—Fleit & Jacobson

[57] ABSTRACT

A method for manufacturing a thin and flexible ribbon of superconductor material such as $V_3Sn$, $V_3Ge$, $V_3Si$, $Nb_3Sn$, $Nb_3Ge$, $Nb_3Si$ and La-Au having a fine and compact microscopic structure comprises heating raw superconductor material at a temperature within the range between its melting point and 300° C. above the melting point to form a melt having suitable wettability and viscosity; ejecting the melt through a nozzle under a pressure within the range from 0.01 to 1.5 atm. against a cooling surface of a moving substrate such as a rotating drum; and cooling instantaneously and very rapidly a jet flow of the melt on the cooling surface at a cooling rate of 1,000° C. to 1,000,000° C./sec. In order to manufacture the thin elongated ribbon of excellent configuration it is preferable to effect the cooling in a reduced atmosphere. The invention also provides the thin and flexible ribbon processed by the above mentioned process. When an intermetallic compound such as Nb-Si, Nb-Sn, Nb-Ge, V-Si, V-Sn and V-Ge is used as the raw superconductor material a thin and flexible ribbon of superconductor material having essentially a crystalline structure is formed. When $La_{1-x}(Au_yCu_{1-y})_x$, wherein $x>0.9$, $0 \leq y \leq 1$ is used as the raw superconductor material it is possible to obtain a thin and flexible ribbon of superconductor material having essentially a fine and compact crystalline structure mixed with amorphous of 10 to 90%.

16 Claims, 2 Drawing Figures

METHOD FOR MANUFACTURING A THIN AND FLEXIBLE RIBBON OF SUPERCONDUCTOR MATERIAL

This is a continuation of application Ser. No. 962,602 filed Nov. 21, 1978, now abandoned.

BACKGROUND OF THE INVENTION

The present invention relates to a method of manufacturing a superconductive thin ribbon essentially consisting of a superconductive material of crystal structure mixed with an amorphous state of 10 to 90% thereof, said superconductive material being selected from $V_3Sn$, $V_3Ge$, $V_3Si$, $Nb_3Sn$, $Nb_3Ge$, $Nb_3Si$, La-Au and the like or their solid-solution or superconductive substance added with an element for improving their characteristics such as $V_3Sn$-$V_3Ga$, which comprises melting a superconductive material into a single phase, and rapid cooling the melt by a moving or rotating cooling substrate, whereby a superconductive thin ribbon having the same composition as the melt is produced.

Hitherto, there is not known a method of manufacturing a superconductive thin ribbon by one process of rapid cooling a melt of superconductive material. Further, La-Au series material is known as superconductive material which is able to become a thin in an amorphous state by rapid cooling. There is known that a superconductor may be obtained by rapid cooling a melt of La-Au material in a piston-anvil apparatus, but its configuration is a mere thin plate but not a thin ribbon, so that it is improper to manufacture a practically effective superconductive magnet with the use of such a thin film. As a result, there is no practical significance for the purpose of application of manufacturing thin ribbon of superconductor. Further, there is known a method of forming an amorphous state of $Nb_3Ga$ by depositing on a substrate by glow discharge. Further, there is known a method of depositing or spattering a superconductor on a substrate, that is, a technique of obtaining a thin film in a partially amorphous state. However, there is not found a method of manufacturing a superconductive thin ribbon or thin strip of the superconductor in a crystalline state mixed with an amorphous state which is practically significant.

In the prior art, the speed for manufacturing a superconductive thin film was so slow and it was industrially very difficult to produce a thin ribbon of superconductor in mass production. For instance, for the purpose of developing high efficiency utilization of electric power energy, high speed transportation system of magnetic floatation, magnetic field confinement apparatus usable for nuclear fusion reactor, it is necessary to realize a superconductive apparatus on a large scale. For fulfilling this requirement, for instance, the process for manufacturing a thin ribbon of superconductor according to the prior art is too complicated and expensive to realize a superconductive magnet on a large scale, so that the development of a method for manufacturing superconductive material at superhigh speed is now urgently desired.

SUMMARY OF THE INVENTION

This invention relates to a method of manufacturing a superconductive thin ribbon essentially consisting of a crystalline structure mixed with an amorphous structure of 10 to 90%. The essential feature of the invention is characterized in that, which comprises melting a superconductive material;

ejecting the melt through a nozzle which hardly reacts with this melt;

cooling instantaneously and very rapidly the melt on the surface of a moving or rotating cooling substrate at a cooling rate of 1,000°–1,000,000° C./sec; and forming a thin ribbon of superconductor;

whereby said thin ribbon of superconductor of crystalline structure mixed with amorphous structure of 10 to 90% is formed.

According to the invention, a speed of manufacturing a superconductive thin ribbon is remarkably higher than that of the method in the prior art. The known superconductor is classified into the so-called first and second kind superconductors. Pure metal elements exclusive of niobium and vanadium belong to the former, while many superconductors made of alloys and intermetallic compounds belong to the latter, which is known as a famous Mathias' Law. Application of superconductivity inclusive of its future development has variously been studied and experimented. A high transition temperature Tc between super and normal conductivities is desired, which is explained by BCS theory, and many superconductive materials of high transition temperature Tc are known on the basis of the BCS theory. It is known that some alloys of normal conductive elements show superconductivity, and some of semiconductors, magnetic materials and oxides become superconductive, and it is recently studied that organic compounds even show a superconductivity. The firstly noted applicable field of superconductor is, besides a transition temperature Tc, a behavior in a strong magnetic field, that is, the second kind superconductive material showing very excellent characteristics in mixing state is remarkably noted and used practically in part. It means that a high critical magnetic field $Hc_2$ is most important, a superconductive phase and a magnetic flux are coexistent in the magnetic field less than that of said critical magnetic field $Hc_2$ and the aforementioned mixed state is formed. With respect to this point, the GLAG theory explains many characteristics of superconductive materials. It is known as this kind superconductor, NbN, Nb-Zr, Nb-Ti, $Nb_3Sn$, $Nb_3Al$, $Nb_3Ge$, $Nb_3Sn$-Al and the like, which belong to the NaCl type or $\beta$-W type crystalline phases. Particularly, in the $\beta$-W type crystalline phase materials are included the noteworthy second kind superconductors, such as $Al_{1-x}Ge_xNb_3$, $AuNb_3$, $Ga_xSn_{1-x}Nb_3$, $GaV_3$, $Ge_{1-x}Sn_xNb_3$, $In_xSn_{1-x}Nb_3$, $PtNb_3$, $Nb_{3-x}Ta_xSn$, $Nb_{3-x}V_xSn$, $SiV_3$, $Si_{1-x}B_xV_3$, $V_3Ga_{1-x}Al_x$, $Si_{1-x}Ge_xV_3$, $SiV_{3-x}Nb_x$, $SiV_{3-x}(Zr, Ti)_x$, $SnTa_3$, $SnTa_xV_{3-x}$ and the like. Besides such $\beta$-W type material, many second kind superconductor crystalline structures are known, such as the aforementioned NaCl type, CsCl type, ZnS type, NiAs type, PbO type and other several tens kinds of crystalline series of superconductor. Further, not only the secondary critical magnetic field $Hc_2$ of these materials but also the primary critical magnetic field $Hc_1$, the tertially critical magnetic field $Hc_3$, Ic have been known. In order to apply these materials to a superconductive apparatus, superconductive characteristics of these materials should be excellent and it is particularly necessary to form a wire or thin ribbon or a thin film of superconductive materials. However, there are quite few materials suitable for partly satisfying this condition and industrially available for manufacture. For example, utmost efforts have been made and led to a result of the Tachikawa's working method for superconductive magnetic material. A β-W type intermetallic compound of superconductor showing good characteristics, such as Nb₃Sn is mechanically very brittle and there are many problems to be solved in working as a wire.

According to the method of the invention, a superconductive thin ribbon of fine and compact crystalline structure mixed with amorphous state of 10 to 90% can be obtained according to the composition. Many elements as described above can be dissolved into a melt of superconductive material.

For instance, a superconductive thin ribbon can be obtained by rapidly cooling a metal made by melting a plurality of intermetallic compound such as Nb-Si, Nb-Sn, Nb-Ge series and, V-Si, V-Sn, V-Ge series, $Nb_{1-x}\cdot V_x$ which are solid-soluble under the crystalline state within the wide range and show the same crystalline structure. A superconductive thin ribbon consisting of intermetallic compound can be obtained by instantaneously rapid cooling at a cooling rate of 1,000° C.-1,000,000° C./sec a melt made by melting a plurality of compounds such as $V_3Sn-Nb_3Sn$, $V_3Sn-Nb_3S-B$, and $(V_2Zr)_{0.90}B_{0.05}P_{0.05}$.

An element selected from boron, bismuth, phosphorus, antimony, aluminum, gallium, tin or their compound and the like can be used as the solid-soluble additional element, which is operable as a glass former to obtain a superconductive thin ribbon of amorphous state. From 0 to 50 atomic percent of this glass former is added to the melt as a viscosity and surface tension controlling agent.

As the other additional element, mention may be made of metal elements contained in a crude crystal, semimetals, gaseous elements such as nitrogen or the like.

The additionable range of these elements to the superconductor is wider than a solid-solubility limit of the superconductor of common crystalline state.

As the further additionable element, mention may be made of all the elements soluble into the melt of superconductor material under the molten state. These additionable elements are effective for changing electric, diamagnetic, optic, elastic properties of a superconductive thin ribbon with or without an amorphous of crystalline texture.

Boron, tin and the like are very effective as a glass former for forming the amorphous state in superconductor material as described hereinafter, adjusting the configuration of a cooled product to be obtained and making the amorphous state in semiconductor material obtainable. Said elements are also effective for regulating the viscosity of a melt and effective for lowering a melting point.

In case of melting superconductive material, the following points should be carefully noted. That is, it is necessary to provide the viscosity for ejecting the melt of superconductive material through a nozzle. If the temperature of the melt of superconductive material becomes higher, the viscosity becomes lower, and as a result, the melt spontaneously exudes through the nozzle and becomes liquiddrop. When melting at a temperature of more than that, the melt spontaneously flows down so as not to obtain any good molten state, and as a result, no amorphous superconductive thin ribbon of good quality can be obtained. Accordingly, the superconductive material should be molten at its melting point or at a temperature slightly higher than the melting point. In order to melt superconductive material, a resistance heating method, particularly a high frequency heating method, is effective, but if the superconductive material can be molten, any other optional heating means can be employed.

The thus molten superconductive material is ejected through a nozzle, but the timing of ejecting is determined when the nozzle reaches immediately above the moving or rotating surface with the aid of a microswitch or the like. In order to obtain a superconductive thin ribbon of good quality, a commonly usable nozzle is a boron nitride ceramic body. In an oxidizing atmosphere such as air or the like, when a melting point of the melt of superconductive material is comparatively low, such as about 1,700° C., it is necessary that the edge portion of the nozzle, particularly the inner surface of the nozzle made of fused silica, platinum or platinum-rhodium, is sufficiently lined with boron nitride or the like for preventing a reaction with said melt to the utmost. When the melting point is higher than that, it is preferable to line the nozzle with alumina, magnesia, beryllia or the like in the same manner. When the superconductive material is heated in vacuum or a reducing atmosphere, it is preferable to line at least the edge portion and inner surface of nozzle made of tungsten, molybdenum and the like or those alloys with boron nitride. As a configuration of the nozzle end, use may be made of circular, elliptical, rectangular shapes, but any configuration can be selected in accordance with the size of a superconductive thin ribbon essentially consisting of crystalline texture or amorphous state to be obtained. If the inner surface of the nozzle is lined with heat-resistant material as described above, the melt of superconductive material is easily ejected through the nozzle and the manufacture thereof beomes easy.

The nozzle for ejecting the melt may be made of a heat resistant material such as boron nitride, silicon nitride, silicon carbide, ceramics, fused silica, semifused alumina, magnesia, beryllium, platinum, platinum-rhodium, molybdenum, tantalum, titanium or carbon.

If a jet pressure of the melt of superconductive material ejected through the nozzle is too high or too low, it is impossible to obtain a superconductive thin ribbon having excellent characteristics and configuration, so that the ejecting pressure is preferably within the range of 0.03-1.5 atmospheric pressure.

In order to obtain a thin ribbon of superconductive material of crystalline structure mixed with an amorphous state of 10 to 90% in good quality, the superconductive material is ejected on the surface of a moving or rotating cooling substrate and instantaneously rapidly cooled at a cooling rate of 1,000°-1,000,000° C./sec, but in this case, as the moving or rotating cooling substrate, use is made of a cooling substrate having a high thermal conductivity such as copper, copperberyllium, brass, aluminum, iron, steel, stainless.

If a moving or rotating speed of this cooling substrate is too slow, the thin ribbon of superconductive material having crystalline structure becomes thick and scaly, while in case of the thin ribbon of superconductive material of crystalline state mixed with amorphous state of 10 to 90% is increased, and the superconductivity is decreased as the increase of crystalline state, so that a linear speed of the moving or rotating cooling substrate is preferably more than 10 m/sec.

A diameter of the moving or rotating cooling substrate should meet with each condition such as a melting temperature of the aforementioned superconductive material, a moving or rotating speed of the cooling substrate and an ejecting pressure through the nozzle. Even if the linear speed on the moving or rotating surface of the cooling substrate is the same, and if the diameter of the moving or rotating cooling substrate is large, the centrifugal force delivered by the moving or rotating substrate is small as compared with the case of the small diameter, and as a result, any good superconductive thin ribbon cannot be obtained from said material having large adhesivity to the moving or rotating cooling substrate, while any good superconductive thin ribbon consisting essentially of crystalline mixed with amorphous state of 10 to 90% cannot be obtained from said material having small adhesivity because a cooling time is too short and a ratio of mixing the amorphous state with crystalline state of superconductive thin ribbon is reduced.

The moving or rotating cooling substrate can be disc-type, drum-type or belt conveyor type. In case of using the disc-type rotating cooling substrate, a flat and smooth rotating surface on the side wall of the substrate is used as a cooling surface of the substrate. In case of using the drum-type rotary cooling substrate, a flat and smooth outer or inner surface thereof can be used as a cooling surface of the substrate or use is made of a contact surface of a pair of rolls pressed with each other. In case of using the belt conveyor type moving cooling substrate, a flat and smooth outer surface can be used as a cooling surface of the substrate as like as the outer surface of a drum type cooling substrate.

BRIEF DESCRIPTION OF THE DRAWINGS

The present invention will be explained in more detail referring to the accompanying drawings, in which.

DESCRIPTION OF THE PREFERRED EMBODIMENTS

Figure 1:
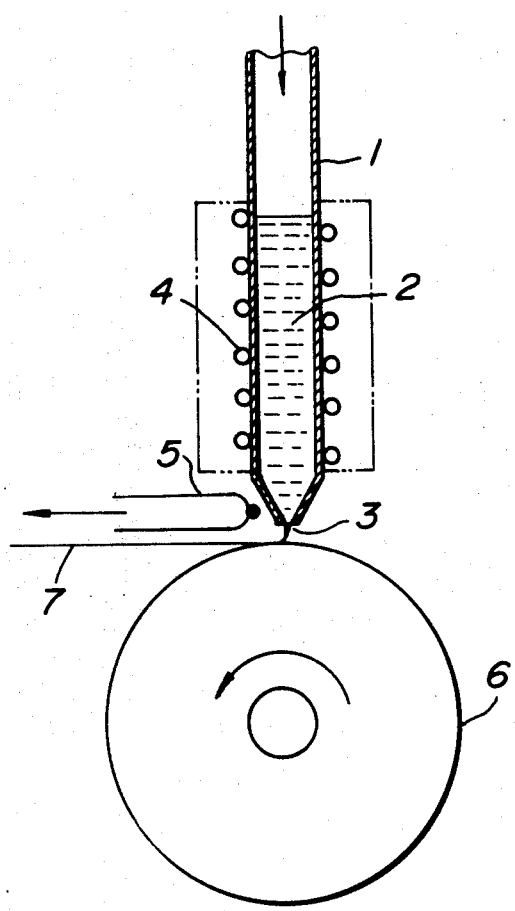
FIG. 1 is a fundamental diagrammatical view of an apparatus for manufacturing a thin ribbon of superconductor material according to the invention.

In FIG. 1, a reference numeral 1 designates a heat resisting tube, 2 a melt of superconductor material, 3 a nozzle, 4 a heater, 5 a thermocouple, 6 a moving or rotating cooling substrate, and 7 a thin ribbon of semiconductive material, respectively.

In FIG. 1, a melt of superconductor material 2 consisting of $V_3Sn$ is contained in a heat resisting tube 1. The heat resisting tube 1 is composed of a fused silica tube lined with boron nitride. The heat resisting tube 1 is provided with a nozzle 3 having a diameter of 0.1–0.5 mm at its free end. The melt of superconductor material 2 in the heat resisting tube 1 is maintained at a temperature of 1,300°–1,450° C. by means of a heating resistor 4. Below the heat resisting tube 1 is rotatably arranged a cooling substrate 6 made of stainless steel. The cooling substrate 6 is 300 mm in diameter and rotated at a speed of 2,500 rpm. The cooling substrate 6 is formed by a drum having a smooth and flat peripheral surface. The nozzle 3 is arranged close to the smooth and flat rotating surface of the drum 6. The melt of $V_3Sn$ in the heat resisting tube 1 is ejected on the rotating surface through the nozzle 3 with adjusting the ejecting pressure within a range of 0.03–1.5 atmospheric pressure. As soon as the melt of superconductive material is made in contact with the rotating surface of the drum 6, the melt is instantaneously very rapidly cooled on the rotating surface at the cooling rate of 1,000°–1,000,000° C./sec and a superconductor thin ribbon having a fine and compact microscopic texture is obtained in a continuous manner.

The thus obtained thin ribbon of superconductor is 5–200 μm in thickness and 0.1–5 mm in width. It was ascertained by an X-ray diffraction image that in most cases this thin ribbon was substantially composed of a uniformly fine crystalline structure mixed with the amorphous state of 10 to 90% throughout.

In case of using a stainless steel roll having a diameter of 60 mm$\phi$ in 2,000 rpm, a superconductive thin ribbon having 0.3 mm of width and 50 μm of thickness was obtained.

Figure 2:
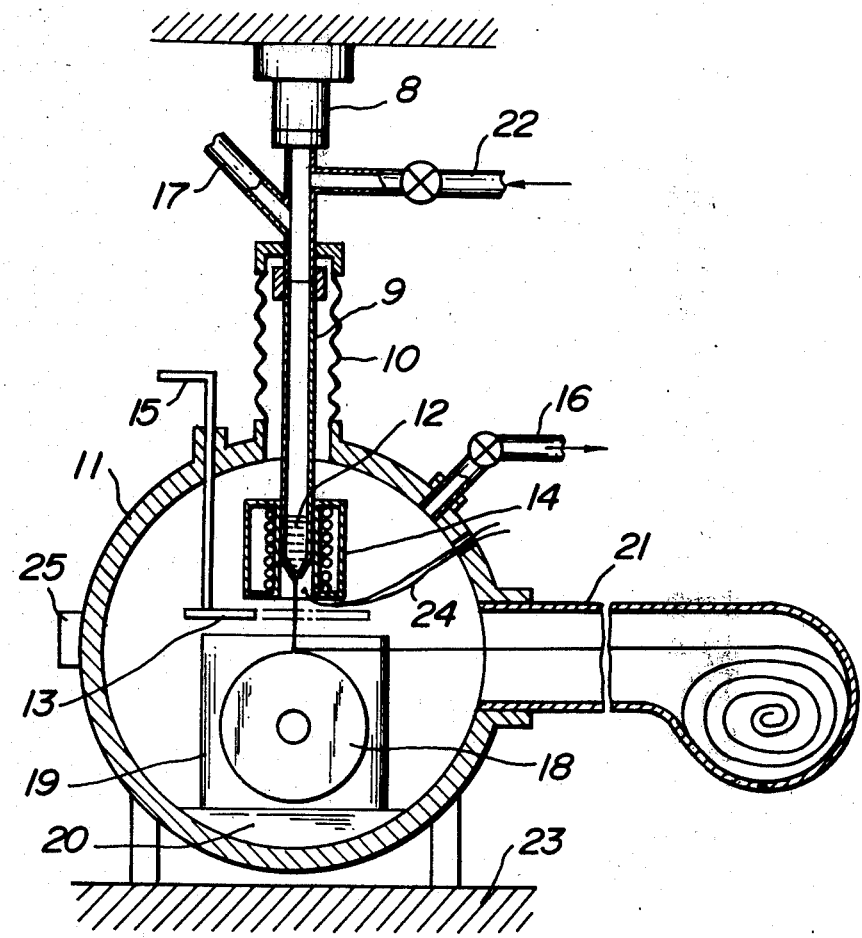
FIG. 2 is a sectional diagrammatical view showing experimental apparatus comprising a vacuum chamber.

Further, the thin ribbon of superconductor consisting of $V_3Sn$-$Nb_3Sn$-B was manufactured in vacuum with the use of a device shown in FIG. 2. In FIG. 2, a sample of said material 12 ($V_3Sn$-$Nb_3Sn$-B) is inserted into a heat resisting tube 9 made of boron nitride and heated to be molten at a temperature of 1,700° C. in an electric furnace 14. A temperature can be measured by a thermocouple 24. In this case, the vacuum chamber 11 placed on a base 23 is evacuated from an outlet 16 by a vacuum pump (not shown) and maintained at high vacuum of $10^{-5}$ Torr. The chamber is provided thereon with a terminal plate 25 and is further provided therein with a cooling substrate device comprising a rotating cooling drum 18 made of Be-Cu alloy having a diameter of 40 mm$\phi$ and a thickness of 2 mm secured to a variable speed motor 19, arranged on a support 20, whose speed varies 0–30,000 rpm. The pressure in the vacuum chamber 11 can be reduced within the range of $10^{-5}$–760 Torr, and the atmosphere can be replaced by nitrogen, argon and the like for further pressure reduction. Prior to ejecting the melt of superconductor material 12, a shutter 13 is opened by handling a knob 15. The shutter 13 is made closed before ejecting the melt for preventing the drum 18 from being heated. Then, an electromagnetic valve (not shown) is turned on to actuate a cylinder 8 so as to lower the tube 9 to a position immediately above the rotating drum 18 which is rotated at a speed of up to 30,000rpm, and argon gas at atmosphere pressure of 400 Torr is forced into the tube through a gas inlet 22. The melt is instantaneously very rapidly cooled on a rotating substrate drum at a cooling rate of 1,000°–1,000,000° C./sec and is throwing away in a form of thin ribbon and gathered together in a collecting port 21 for taking out after the completion of the ejection. In this experimental device, it is possible to change a raw material into an inlet 17 after heating the tube 9. This device has an advantage in that any damage such as deformation or oxidation in the thin ribbon due to collision with the fluid in atmosphere resulting from the rapid formation of the thin ribbon by the evacuation of vacuum chamber is considerably mitigated by reducing an atmospheric pressure of the chamber, so that this device is very effective for obtaining long thin ribbon. In order to prevent an excessive oxidation for ribbon, it is preferable to use an inert gas as the atmosphere at the reduced atmospheric pressure or vacuum.

The thus obtained thin ribbon by instantaneously very rapid cooling the melt of superconductive material of $V_3Sn$-$Nb_3Sn$-B was 1.0 mm in width, 10 μm in thickness and more than 10 cm in length.

In another embodiment, a superconductive material consisting of $(V_2Zr)_{0.90}B_{0.05}P_{0.05}$ in atom.% was heated at 1,500°–1,900° C. in an alumina tube coated with boron nitride by means of a silicon carbide heater to form a melt and the melt was ejected onto a smooth and flat outer surface of a drum type rotating cooling substrate made of beryllium copper alloy having 70 mm$\phi$ in diameter and rotating at 6,000-20,000 rpm with the aid of argon at 0.03-1 atmospheric pressure through a nozzle having a diameter of 0.1-0.5 mm$\phi$ and made of semifused alumina nozzle lined with boron nitride to obtain a thin ribbon of superconductor having 10-40 $\mu$m in thickness and 0.2-1.0 mm in width. In this case, the whole rotating cooling substrate device was put into the above vacuum chamber 11 which was previously filled with argon gas of 0.3-1 atmospheric pressure for preventing oxidation of produced thin ribbon of superconductor and reduced in pressure. The non-oxidizing atmosphere is effective to prevent an oxidation of the surface of said thin ribbon in which a good quality of thin ribbon can be expected. Further, the effect of pressure reduction was remarkable in this embodiment. The deformation due to the collision of the thin ribbon with the gas or air in the atmosphere is reduced in vacuum or the reduced pressure and as a result, a long thin ribbon having a good quality becomes obtainable.

When a part of this thin superconductive ribbon was observed by a polarizing metal microscope, it was in the dark grey state under the cross nicol state, and a boundary of crystal of the thin ribbon was only visible, and a characteristic of the fine and compact crystalline structure mixed with the amorphous state was observed. The electric and magnetic properties of the thin ribbon of superconductor were examined and it is found that these electric and magnetic properties are comparatively superior to those of the conventional superconductive thin films.

Besides the above properties, the characteristics of the superconductive thin ribbon obtained by the method according to the invention will be explained as follows.

It is very important characteristics that mechanical strength of superconductive material of the thin ribbon according to the present invention is very high, even if thin ribbon having same thickness and same size is bent, its bending strength up to a fracture limit in the thin ribbon according to the present invention shows a high value of 2-6 times of those of superconductors with a common crystalline structure.

If the intermetallic compound such as La-Au or $La_{1-x}(Au_yCu_{1-y})_x$ (wherein $x>0.9$, $0 \leq y \leq 1$) is used as the raw material for manufacturing the superconductive thin ribbon, the superconductive thin ribbon essentially consisting of amorphous state is obtained. In this case, the superconductivity is deteriorated by the increase of crystalline state in this obtained superconductor.

Further, the bending strength up to a fracture limit in the thin ribbon of amorphous including superconductor shows a high value of 5-100 times of those of the common superconductor. In other words, the mechanical strength of the superconductive thin ribbon according to the invention is considerably higher.

The amorphous state included in the amorphous superconductive thin ribbon made of intermetallic compound is preferable to fall within not less than 30% in volume ratio, if possible. If said amorphous state becomes less than 30%, the mechanical strength is deteriorated and the element of superconductor apparatus cannot be easily carried out occasionally.

If the intermetallic compound such as Nb-Si, Nb-Sn, Nb-Ge series and V-Si, V-Sn, V-Ge series intermetallic compound is used as the raw material of superconductor, the thin ribbon of superconductor essentially consisting of crystalline structure mixed with the amorphous is obtained.

As described above, according to the invention, a thin ribbon of superconductor or superconductor partially including amorphous state mixed with crystal state in a ratio of 10-90% is obtained with the fine compact structure by ejecting a melt of superconductor material through a nozzle and rapidly cooling it on the moving surface of a cooling substrate. The thus obtained thin ribbon can be manufactured at a remarkably high speed as compared with the conventional method for manufacturing a conventional superconductor ribbon with the polycrystal structure and it is very effective for use in such superconductive apparatus that a large volume of superconductor elements are required.

The superconductive thin ribbon having the fine compact crystalline structure mixed with the amorphous is usable as superconductive magnet, motor, generator, transformer, power cable, superconductive Josephson's junction element, high frequency electronic apparatus, memory element, cryotron, microwave oscillation apparatus, microwave detecting apparatus, three-dimensional circuit, photoelectric element, thermoelectric element, magnetic field detecting element, magnetically cooling element and the like and it is remarkably valuable in those industries.

It is very important to select the material of cooling substrate depending upon semiconductor material to be used by taking into account a wettability between the melt of semiconductor material and the cooling substrate. The wettability is mainly determined by surface tensions of the melt and the substrate, and the viscosity of the melt. When the temperature of melt is too high more than 300° C. above the melting point, the melt might spread over the cooling surface of the substrate so that the ribbon becomes too thin and some times a greatly notched ribbon similar to a rattan blind might be produced, while when the temperature of melt is too low, the jet flow of the melt might not creep along the surface of the substrate, so that the jet flow is divided into a number of small particles having irregular configuration. According to the invention, it is preferable to select such a viscosity of the melt that edges of the melt are made in contact with the substrate at an angle from 10° to 170°, preferably 45°-135°, with respect to the substrate surface. For this purpose, the temperature of melt should be selected within the range from the melting point to 300° C. above the melting point, particularly 100° C. to 150° C. above the melting point.

It is also very important that the melt of superconductor material should be instantaneously very rapidly cooled on the cooling substrate at a suitable cooling rate of at least more than 1,000° C., preferably 1,000° to 1,000,000° C./sec by taking account of wettability between the melt of superconductor material and the cooling substrate.

According to the invention, it has been found that the pressure under which the melt is ejected through the nozzle should be within the range of 0.01-1.5 atm.

The pressure for ejecting the melt is mainly determined by taking account of the viscosity of the melt, i.e., the surface tension of the melt. If the pressure for ejecting the melt is lower than 0.01 atm., the melt cannot be ejected without exuding in the low viscosity and if the pressure for ejecting the melt is higher than 1.5 atm., the melt cannot be ejected without making the mist of the melt.

The ejection of the melt is preferably effected in a vacuum but it may be carried out in an inert gas or reducing gas atmosphere. Even in the latter case, it is preferable to reduce the pressure.

The reason why the atmosphere is preferably in vacuum or in a reduced pressure in the followings. If the melt is flown into the atmosphere under pressure, the melt flow collides to gas under pressure, the resulted thin ribbon shall be in a greatly notched condition similar to a rattan blind or in partially shredding, contorting or corrugation condition.

According to the invention, it is possible to manufacture the thin and flexible ribbon of superconductor material of a fine microscopic structure of high density having a large mechanical strength and an excellent superconductivity. Therefore, various superconductor devices can be manufactured by using such a ribbon of superconductor in a simple and reliable manner.

What is claimed is:

1. A thin and flexible ribbon of superconductor material having a fine and compact microscopic structure, processed by:
  (a) heating a material consisting essentially of a raw superconductor material selected from the group of intermetallic compounds consisting of Nb-Si, Nb-Sn, Nb-Ge, V-Si, V-Sn, V-Ge, La-Au, and $La_{1-x}(Au_yCu_{1-y})_x$, wherein $x>0.9$, $0 \leq y \leq 1$ to form a uniform melt at a temperature within the range between the melting point of the raw material and 300° C. above the melting point;
  (b) adding a glass former selected from the group consisting of boron, bismuth, phosphorous, antimony, gallium, tin, in an amount not greater than 50 atomic percent of the raw superconductor material to the melt to produce a melt having suitable wettability and viscosity;
  (c) ejecting the melt through a nozzle under a pressure of 0.01–1.5 atm. against a cooling surface of a moving substrate; and
  (d) cooling a jet flow of the melt at a cooling rate of 1,000° C. to 1,000,000° C./sec.

2. A thin and flexible ribbon of superconductor material as defined in claim 1, wherein the ribbon has a thickness within the range from 5 to 200 μm.

3. A thin and flexible ribbon of superconductor material as defined in claim 1, wherein the ribbon includes a fine crystalline grain structure, and wherein more than 50% of the grains have a diameter within the range from 1 to 100 μm.

4. A thin and flexible ribbon of superconductor material as defined in claim 1, wherein the raw superconductive material is an intermetallic compound selected from the group consisting of Nb-Si, Nb-Sn, Nb-Ge, V-Si, V-Sn and V-Ge, and wherein the ribbon is essentially of crystalline texture.

5. A thin and flexible ribbon of superconductor material as defined in claim 1, wherein the raw material is an intermetallic compound selected from the group consisting of La-Au and $La_{1-x}(Au_yCu_{1-y})_x$, wherein $x>0.9$, $0 \leq y \leq 1$ and wherein the ribbon is in essentially an amorphous state.

6. A method of manufacturing a thin and flexible ribbon of superconductor material having a fine and compact microscopic structure comprising:
  (a) heating a material consisting essentially of a raw superconductor material selected from the group of intermetallic compounds consisting of Nb-Si, Nb-Sn, Nb-Ge, V-Si, V-Sn, V-Ge, La-Au, and $La_{1-x}(Au_yCu_{1-y})_x$, wherein $x>0.9$, $0 \leq y \leq 1$ to form a uniform melt at a temperature of within the range between the melting point of raw material and 300° C. above said melting point to produce a melt having a suitable wettability and viscosity;
  (b) adding a glass former selected from the group consisting of boron, bismuth, phosphorous, antimony, gallium, and tin in an amount of not greater than 50 atomic percent of the raw superconductor to the melt;
  (c) ejecting the melt through a nozzle under a pressure of 0.01–1.5 atm. against an outer cooling surface of a moving substrate having good wettability for said melt; and
  (d) cooling a jet flow of the melt at a cooling rate of 1,000° C. to 1,000,000° C./sec, whereby a flexible ribbon of superconductor material having a microscopic crystalline structure mixed with an amorphous state in a ratio of from about 10 to 90% is produced.

7. A method as defined in claim 6, wherein the raw material of superconductor is heated at a temperature within the range between the melting point and 100°–150° C. above the melting point.

8. A method as defined in claim 6, wherein the step of ejecting of the the melt against the cooling surface of the moving substrate is carried out in an inert gas atmosphere at a reduced pressure.

9. A method as defined in claim 6, wherein the step of ejecting the melt against the cooling surface of the moving substrate is conducted in a vacuum.

10. A method as defined in claim 6, wherein said nozzle for ejecting the melt comprises a heat resistant material selected from the group consisting of boron nitride, silicon nitride, silicon carbide, ceramics, fused silica, semi-fused alumina, magnesia, beryllium, platinum, platinum-rhodium, tungsten, molybdenum, tantalum, titanium and carbon.

11. A method as defined in claim 10, wherein the nozzle is lined with boron nitride in at least the edge and inner edge portion of the nozzle.

12. A method as defined in claim 6, wherein the pressure for ejecting the melt through the nozzle is selected from the range from 0.01 to 1.5 atm.

13. A method as defined in claim 6, wherein the cooling substrate is made of material selected from the group consisting of copper, copper-beryllium, brass, stainless steel and carbon steel.

14. A method as defined in claim 6, wherein the rotating cooling substrate is selected from a rotating drum and disc having at least one of a smooth inner surface and a smooth outer surface.

15. A method as defined in claim 6, wherein the cooling substrate is an endless belt conveyor having a smooth outer surface.

16. A method as defined in claim 6, wherein the nozzle comprises a single hole selected from the group consisting of circular, elliptical and rectangular configurations.

* * * * *

UNITED STATES PATENT AND TRADEMARK OFFICE
CERTIFICATE OF CORRECTION

PATENT NO. : 4,339,508
DATED     : July 13, 1982
INVENTOR(S) : Noboru TSUYA and Kenichi ARAI It is certified that error appears in the above-identified patent and that said Letters Patent is hereby corrected as shown below:

In the title page,

Change: "[73] Assignee: Shiro Maeda,"

To:  -- [73] Assignee: Shiro Maeda, President of Tohoku University --

Signed and Sealed this

Fifth Day of March 1985

[SEAL]

Attest:

DONALD J. QUIGG

*Attesting Officer*     *Acting Commissioner of Patents and Trademarks*